United States Patent
Mi et al.

(10) Patent No.: US 11,373,613 B2
(45) Date of Patent: Jun. 28, 2022

(54) SHIFT REGISTER UNIT INCLUDING PULL-UP NODE STATE MAINTENANCE CIRCUIT, DRIVING METHOD THEREOF, GATE DRIVING CIRCUIT AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Lei Mi, Beijing (CN); Shijun Wang, Beijing (CN); Yanna Xue, Beijing (CN); Zhiying Bao, Beijing (CN); Yong Zhang, Beijing (CN); Wenjun Xiao, Beijing (CN); Lu Bai, Beijing (CN); Gang Hua, Beijing (CN); Jingpeng Wang, Beijing (CN); Haobo Fang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 751 days.

(21) Appl. No.: 16/320,821

(22) PCT Filed: Apr. 25, 2018

(86) PCT No.: PCT/CN2018/084489
§ 371 (c)(1),
(2) Date: Jan. 25, 2019

(87) PCT Pub. No.: WO2019/033783
PCT Pub. Date: Feb. 21, 2019

(65) Prior Publication Data
US 2021/0335305 A1    Oct. 28, 2021

(30) Foreign Application Priority Data

Aug. 16, 2017   (CN) .......................... 201710701895.5

(51) Int. Cl.
*G09G 3/3266*   (2016.01)
*G09G 3/36*     (2006.01)
*G11C 19/28*    (2006.01)

(52) U.S. Cl.
CPC ........... *G09G 3/3677* (2013.01); *G11C 19/28* (2013.01); *G09G 2300/0408* (2013.01);
(Continued)

(58) Field of Classification Search
CPC ................ G06F 1/1643; G09G 3/3266; G09G 3/3611–38; G09G 2300/0408;
(Continued)

(56) References Cited

U.S. PATENT DOCUMENTS

2011/0150169 A1   6/2011   Lin et al.
2013/0070891 A1   3/2013   Tsai et al.
(Continued)

FOREIGN PATENT DOCUMENTS

CN   102779478 A   11/2012
CN   103871350 A   6/2014
(Continued)

OTHER PUBLICATIONS

2nd Chinese Office Action, English Translation.
(Continued)

*Primary Examiner* — Sanghyuk Park
(74) *Attorney, Agent, or Firm* — Brooks Kushman P.C.

(57) ABSTRACT

The present disclosure provides a shift register unit, a driving method thereof, a gate driving circuit and a display device. The shift register unit includes a pull-up node state maintenance circuitry connected to a pull-up node and a first
(Continued)

control voltage input end, and configured to control the pull-up node to be electrically connected to, or electrically disconnected from, the first control voltage input end in accordance with a potential at the pull-up node and an input potential at the first control voltage input end.

18 Claims, 2 Drawing Sheets

(52) U.S. Cl.
CPC ............ *G09G 2300/0426* (2013.01); *G09G 2310/0286* (2013.01); *G09G 2310/0289* (2013.01)

(58) Field of Classification Search
CPC .......... G09G 2310/02–068; G09G 2300/0426; G11C 19/28
See application file for complete search history.

(56) References Cited

U.S. PATENT DOCUMENTS

| | | | |
|---|---|---|---|
| 2014/0093028 A1 | 4/2014 | Wu | |
| 2014/0177780 A1* | 6/2014 | Qi | G09G 3/20 377/64 |
| 2015/0206597 A1 | 7/2015 | Liao et al. | |
| 2015/0378472 A1* | 12/2015 | Hekstra | G06F 3/04166 345/17 |
| 2016/0049126 A1 | 2/2016 | Zhang et al. | |
| 2016/0247442 A1 | 8/2016 | Dai et al. | |
| 2017/0108989 A1 | 4/2017 | Gu et al. | |
| 2017/0186352 A1* | 6/2017 | Lin | G06F 3/0412 |
| 2018/0046311 A1 | 2/2018 | Gu et al. | |
| 2018/0190364 A1 | 7/2018 | Gu et al. | |
| 2018/0197497 A1 | 7/2018 | Shao et al. | |
| 2018/0286490 A1 | 10/2018 | Sun et al. | |
| 2019/0057637 A1 | 2/2019 | Fan et al. | |
| 2020/0193886 A1 | 6/2020 | Hao | |

FOREIGN PATENT DOCUMENTS

| | | |
|---|---|---|
| CN | 104036738 A | 9/2014 |
| CN | 104505049 A | 4/2015 |
| CN | 105185343 A | 12/2015 |
| CN | 106023919 A | 10/2016 |
| CN | 106486049 A | 3/2017 |
| CN | 106531052 A | 3/2017 |
| CN | 106531118 A | 3/2017 |
| CN | 106601176 A | 4/2017 |
| CN | 106847160 A | 6/2017 |
| CN | 206388486 U | 8/2017 |
| CN | 107452425 A | 12/2017 |
| EP | 3573047 A1 | 11/2019 |
| KR | 20140064319 A | 5/2014 |
| WO | 2017121176 A1 | 7/2017 |

OTHER PUBLICATIONS

CN206388486U, English Abstract and U.S. Equivalent U.S. Pub. No. 2020/0193886.
International Search Report and Written Opinion, English Translation.
CN107452425A, English Abstract and Machine Translation.
CN106531118A, English Abstract and U.S. Equivalent U.S. Pub. No. 2018/0197497.
CN106023919A, English Abstract and Machine Translation.
CN105185343A, English Abstract and U.S. Equivalent U.S. Pub. No. 2017/0108989.
CN104036738A, English Abstract and U.S. Equivalent U.S. Pub. No. 2016/0049126.
CN104505049A, English Abstract and U.S. Equivalent U.S. Pub. No. 2016/0247442.
Partial European Search Report, English Translation.
CN106531052A, English Abstract and U.S. Equivalent U.S. Pub. No. 2018/0190364.
WO2017121176A1, English Abstract and U.S. Equivalent U.S. Pub. No. 2018/0046311.
Second Office Action for Chinese Application No. 201710701895.5, dated Jul. 17, 2020, 7 Pages.
Extended European Search Report for Application No. 18833817.2, dated May 18, 2020, 12 Pages.
Song et al., "Depletion Mode Oxide TFT Shift Register for Variable Frame Rate AMOLED Displays," IEEE Electron Device Letters, Mar. 2015, pp. 247-249, vol. 36, No. 3 (3 pages total).
First Office Action for Chinese Application No. 201710701895.5, dated Oct. 9, 2019, 8 Pages.
International Search Report and Written Opinion for Application No. PCT/CN2018/084489, dated Jul. 9, 2018, 10 Pages.
1st Chinese Office Action, English Translation.
CN106486049A, English Abstract and Machine Translation.
CN103871350A, English Abstract and U.S. Equivalent U.S. Pub. No. 2015/0206597.
CN102779478A, English Abstract and U.S. Equivalent U.S. Pub. No. 2014/0093028.
CN106601176A, English Abstract and U.S. Equivalent U.S. Pub. No. 2019/0057637.
KR20140064319A, English Abstract and Machine Translation.
CN106847160A, English Abstract and U.S. Equivalent U.S. Pub. No. 2018/0286490.
Partial European Search Report for European Patent Application No. 18833817.2, dated Feb. 21, 2020, 12 Pages.

* cited by examiner

SHIFT REGISTER UNIT INCLUDING PULL-UP NODE STATE MAINTENANCE CIRCUIT, DRIVING METHOD THEREOF, GATE DRIVING CIRCUIT AND DISPLAY DEVICE

CROSS-REFERENCE TO RELATED APPLICATIONS

This application is the U.S. national phase of PCT Application No. PCT/CN2018/084489 filed on Apr. 25, 2018, which claims priority to Chinese Patent Application No. 201710701895.5 filed on Aug. 16, 2017, which are incorporated herein by reference in their entireties.

TECHNICAL FIELD

The present disclosure relates to the field of display driving technology, in particular to a shift register unit, a driving method thereof, a gate driving circuit and a display device.

BACKGROUND

In an in-cell touch mode, a touch function is integrated into a Liquid Crystal Display (LCD) panel, so as to reduce the manufacture cost. In actual use, each frame is divided into a plurality of time periods. A touch driving operation is performed within a blanking time period, and after the blanking time period is inserted between two adjacent row scanning operations, a display operation between the row scanning operations needs to be paused for a certain time period, so a Gate On Array (GOA) circuit (a gate driving circuit arranged on an array substrate) is highly demanded. It is necessary to maintain a stable potential at a pull-up node. For an amorphous silicon (a-Si) Full-in-Cell display product, such a defect as stripes at different brightness values may occur for an LH Blanking touch driving mode. When each frame is divided into at least three display time periods and at least two touch time periods each arranged between two adjacent display time periods, it is impossible to ensure a normal display effect between the two display time periods, so the stripes may occur. To be specific, it is difficult to maintain the potential at the pull-up node of a shift register unit between the two display time periods, and there exists a difference between an output from a corresponding row of gate electrodes and the other rows in a normal state, so the stripes may occur, and even more serious at a high temperature.

SUMMARY

In one aspect, the present disclosure provides in some embodiments a shift register unit, including a pull-up node state maintenance circuitry connected to a pull-up node and a first control voltage input end, and configured to control the pull-up node to be electrically connected to, or electrically disconnected from, the first control voltage input end in accordance with a potential at the pull-up node and an input potential at the first control voltage input end, thereby to maintain the potential at the pull-up node. The pull-up node is a connection point where an input circuitry, an output circuitry and a resetting circuitry of the shift register unit are connected to each other.

In a possible embodiment of the present disclosure, the shift register unit further includes: an input transistor, a gate electrode of which is connected to a signal input end, and a first electrode of which is connected to a first level signal end; an output transistor, a first electrode of which is connected to a clock signal input end, and a second electrode of which is connected to a gate driving signal output end; and a storage capacitor, a first end of which is connected to a gate electrode of the output transistor, and a second end of which is connected to the gate driving signal output end. A connection point where a second electrode of the input transistor, the first end of the storage capacitor and the gate electrode of the output transistor are connected to each other is the pull-up node.

In a possible embodiment of the present disclosure, the pull-up node state maintenance circuitry includes: a pull-up control node control sub-circuitry connected to the pull-up node, the first control voltage input end and a pull-up control node, and configured to control the pull-up control node to be electrically connected to, or electrically disconnected from, the first control voltage input end in accordance with the potential at the pull-up node; and a pull-up node state maintenance sub-circuitry connected to the pull-up control node, the first control voltage input end and the pull-up node, and configured to control the pull-up node to be electrically connected to, or electrically disconnected from, the first control voltage input end in accordance with the potential at the pull-up control node.

In a possible embodiment of the present disclosure, the pull-up control node control sub-circuitry includes a pull-up control node control transistor, a gate electrode of which is connected to the pull-up node, a first electrode of which is connected to the first control voltage input end, and a second electrode of which is connected to the pull-up control node.

In a possible embodiment of the present disclosure, the pull-up node state maintenance sub-circuitry includes a pull-up node state maintenance transistor, a gate electrode of which is connected to the pull-up control node, a first electrode of which is connected to the first control voltage input end, and a second electrode of which is connected to the pull-up node.

In a possible embodiment of the present disclosure, the pull-up node state maintenance sub-circuitry further includes a switching circuitry connected between the second electrode of the pull-up node state maintenance transistor and the pull-up node. A control end of the switching circuitry is connected to the pull-up control node. The switching circuitry is configured to control the second electrode of the pull-up node state maintenance transistor to be electrically connected to, or electrically disconnected from, the pull-up node under the control of the pull-up control node.

In a possible embodiment of the present disclosure, the switching circuitry includes a switching transistor, a gate electrode of which is connected to the pull-up control node, a first electrode of which is connected to the second electrode of the pull-up node state maintenance transistor, and a second electrode of which is connected to the pull-up node.

In a possible embodiment of the present disclosure, the switching circuitry includes: a first switching transistor, a gate electrode of which is connected to the pull-up control node, and a first electrode of which is connected to the second electrode of the pull-up node state maintenance transistor; and a second switching transistor, a gate electrode of which is connected to the pull-up control node, a first electrode of which is connected to a second electrode of the first switching transistor, and a second electrode of which is connected to the pull-up node.

In a possible embodiment of the present disclosure, the switching circuitry includes N switching transistors, where N is an integer greater than 2. A gate electrode of a first switching transistor is connected to the pull-up control node, and a first electrode of the first switching transistor is connected to the second electrode of the pull-up node state maintenance transistor. A gate electrode of an $n^{th}$ switching transistor is connected to the pull-up control node, and a first electrode of the $n^{th}$ switching transistor is connected to a second electrode of an $(n-1)^{th}$ switching transistor, where n is an integer greater than 1 and smaller than N. A gate electrode of an $N^{th}$ switching transistor is connected to the pull-up control node, a first electrode of the $N^{th}$ switching transistor is connected to a second electrode of an $(N-1)^{th}$ switching transistor, and a second electrode of the $N^{th}$ switching transistor is connected to the pull-up node.

In a possible embodiment of the present disclosure, the pull-up node state maintenance circuitry include a transistor, a gate electrode and a drain electrode of which are connected to the pull-up node, and a source electrode of which is connected to the first control voltage input end.

In a possible embodiment of the present disclosure, the shift register unit further includes a pull-down node state maintenance circuitry connected to a pull-down node, a second control voltage input end and a first level input end, and configured to control the pull-down node to be electrically connected to, or electrically disconnected from, the first level input end in accordance with an input potential at the second control voltage input end.

In a possible embodiment of the present disclosure, the pull-down node state maintenance circuitry includes a pull-down node maintenance transistor, a gate electrode of which is connected to the second control voltage input end, a first electrode of which is connected to the pull-down node, and a second electrode of which is connected to the first level input end.

In another aspect, the present disclosure provides in some embodiments a method for driving the above-mentioned shift register unit, including, within a touch time period, applying a high voltage to a first control voltage input end, so as to enable a pull-up node state maintenance control circuitry to control a pull-up node of the shift register unit corresponding to a currently-scanned gate line to be electrically connected to the first control voltage input end.

In a possible embodiment of the present disclosure, the method further includes, within a display time period, applying a low voltage to the first control voltage input end, so as to enable the pull-up node state maintenance circuitry to control the pull-up nodes of the shift register units corresponding all the gate lines to be electrically disconnected from the first control voltage input end.

In a possible embodiment of the present disclosure, the shift register unit includes a pull-down node state maintenance circuitry connected to a pull-down node, a second control voltage input end and a first level input end, and configured to control the pull-down node to be electrically connected to, or electrically disconnected from, the first level input end in accordance with an input potential at the second control voltage input end. The method further includes applying a low-level direct current signal to the first level input end, and controlling a voltage applied to the second control voltage input end within the touch time period, so as to enable the pull-down node state maintenance circuitry to control the pull-down node of the shift register unit corresponding to the currently-scanned gate line to be electrically connected to the first level input end.

In a possible embodiment of the present disclosure, the method further includes, within the display time period, controlling the voltage applied to the second control voltage input end, so as to enable the pull-down node state mainte-nance circuitry to control the pull-down nodes of the shift register units corresponding to all the gate lines to be electrically disconnected from the first level input end.

In a possible embodiment of the present disclosure, the pull-down node state maintenance circuitry includes an N-type transistor configured to apply a same control voltage to the first control voltage input end and the second control voltage input end.

In a possible embodiment of the present disclosure, each frame includes at least two touch time periods and at least two display time periods arranged alternately.

In yet another aspect, the present disclosure provides in some embodiments a gate driving circuit including a plurality of the above-mentioned shift register units connected to each other in a cascaded manner.

In still yet another aspect, the present disclosure provides in some embodiments a display device including the above-mentioned gate driving circuit.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

All transistors adopted in the embodiments of the present disclosure may be TFTs, field effect transistors (FETs) or any other elements having an identical characteristic. In order to differentiate two electrodes other than a gate electrode from each other, one of the two electrodes is called as first electrode and the other is called as second electrode. In actual use, the first electrode may be a drain electrode while the second electrode may be a source electrode, or the first electrode may be a source electrode while the second electrode may be a drain electrode.

Figure 1:
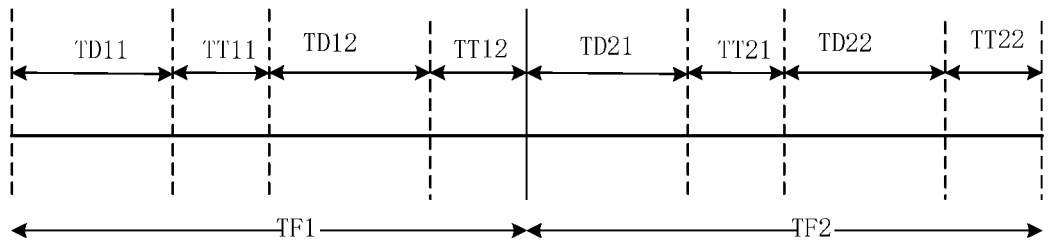
FIG. 1 is a schematic view showing the division of each frame in a conventional LH blanking touch driving mode.

In a commonly-adopted LH Blanking touch driving mode with a high touch frequency, a blanking time period is inserted between two adjacent row scanning operations. FIG. 1 shows the division of each frame in the LH blanking touch driving mode. In FIG. 1, TF1 represents a first frame, TF2 represents a second frame, TD11 represents a first display time period included in TF1, TT11 represents a first blanking time period included in TF1, TD12 represents a second display time period included in TF1, TT12 represents a second blanking time period included in TF1, TD21 represents a first display time period included in TF2, TT21 represents a first blanking time period included in TF2, TD22 represents a second display time period included in TF2, and TT22 represents a second blanking time period included in TF2. Here, the division mode in FIG. 1 is merely for illustrative purposes, and in actual use, each frame may be divided into more time periods.

A touch driving operation is performed within the blanking time period, and after the blanking time period is inserted between two adjacent row scanning operations, a display operation between the row scanning operations needs to be paused for a certain time period, so a GOA circuit (a gate driving circuit arranged on an array substrate) is highly demanded. It is necessary to maintain a stable potential at a pull-up node. For an a-Si Full-in-Cell display product, such a defect as stripes at different brightness values may occur for an LH Blanking touch driving mode. When each frame is divided into at least three display time periods and at least two touch time periods each arranged between two adjacent display time periods, it is impossible to ensure a normal display effect between the two display time periods, so the stripes may occur. To be specific, it is difficult to maintain the potential at the pull-up node of a shift register unit between the two display time periods, and there exists a difference between an output from a corresponding row of gate electrodes and the other rows in a normal state, so the stripes may occur, and even more serious at a high temperature.

A main object of the present disclosure is to provide a shift register unit, a driving method thereof, a gate driving circuit and a display device, so as to solve the problem in the related art where it is difficult to maintain the potential at the pull-up node of the shift register unit between the two display time periods, and there exists a difference between an output from a corresponding row of gate electrodes and the other rows in a normal state, so the stripes may occur, and even more serious at a high temperature.

Figure 2:
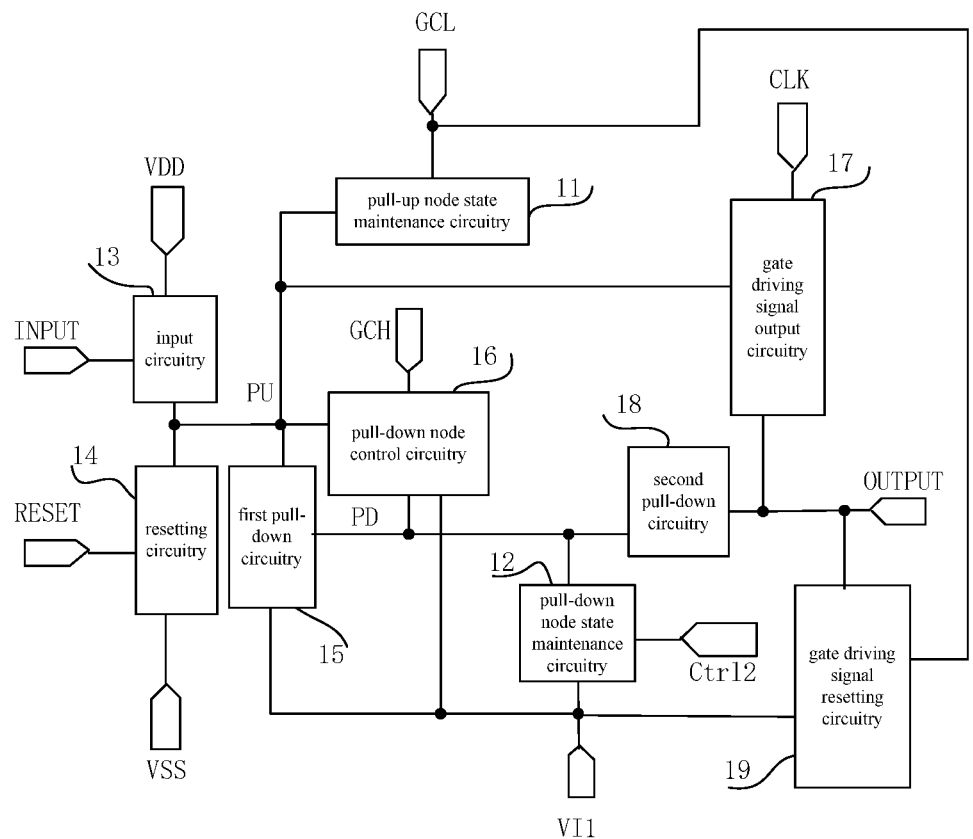
FIG. 2 is a block diagram showing a shift register unit according to some embodiments of the present disclosure.

As shown in FIG. 2, the present disclosure provides in some embodiments a shift register unit, which for example includes: an input circuitry 13 connected to a pull-up node PU, an input end INPUT and a high voltage input end for inputting a high voltage VDD, and configured to control the pull-up node PU to be electrically connected to, electrically disconnected from, the high voltage input for inputting the high voltage VDD in accordance with a potential at the input end INPUT; a gate driving signal output circuitry 17 connected to the pull-up node PU, a clock signal input end CLK and a gate driving signal output end OUTPUT, and configured to control the gate driving signal output end OUTPUT to be electrically connected to, or electrically disconnected from, the clock signal input end CLK in accordance with a potential at the pull-up node PU; a resetting circuitry 14 connected to the pull-up node PU, a resetting end RESET and a low voltage input end for inputting a low voltage VSS, and configured to control the pull-up node PU to be electrically connected to, or electrically disconnected from, the low voltage input end for inputting the low voltage VSS in accordance with a potential at the resetting end RESET; a gate driving signal resetting circuitry 19 connected to a first control voltage input end GCL, the gate driving signal output end OUTPUT and a first level input end VI1, and configured to control the gate driving signal output end OUTPUT to be electrically connected to, or electrically disconnected from, the first level input end VI1 in accordance with an input potential at the first control voltage input end GCL; a pull-up node state maintenance circuitry 11 connected to the pull-up node PU and the first control voltage input end GCL, and configured to control the pull-up node PU to be electrically connected to, or electrically disconnected from, the first control voltage input end GCL in accordance with the potential at the pull-up node PU and the input potential at the first control voltage input end GCL; a pull-down node state maintenance circuitry 12 connected to a pull-down node PD, a third control voltage input end GCH and the first level input end VI1, and configured to control the pull-down node PD to be electrically connected to, or electrically disconnected from, the first level input end VI1 in accordance with an input potential at the third control voltage input end GCH; a pull-down node control circuitry 16 connected to the third control voltage input end GCH, the pull-down node PD, the pull-up node PU and the first level input end VI1, and configured to control a potential at the pull-down node PD in accordance with the input potential at the third control voltage input end GCH and the potential at the pull-up node PU; a first pull-down circuitry 15 connected to the pull-up node PU, the pull-down node PD and the first level input end VI1, and configured to control the pull-up node PU to be electrically connected to, or electrically disconnected from, the first level input end VI1 in accordance with the potential at the pull-down node PD; and a second pull-down circuitry 18 connected to the pull-down node PD, the gate driving signal output end OUTPUT and the first level input end VI1, and configured to control the gate driving signal output end OUTPUT to be electrically connected to, or electrically disconnected from, the first level input end VI1 in accordance with the potential at the pull-down node PD.

In actual use, the first level input end VI1 may be, but not limited to, a low level input end for inputting a low level.

Figure 3:
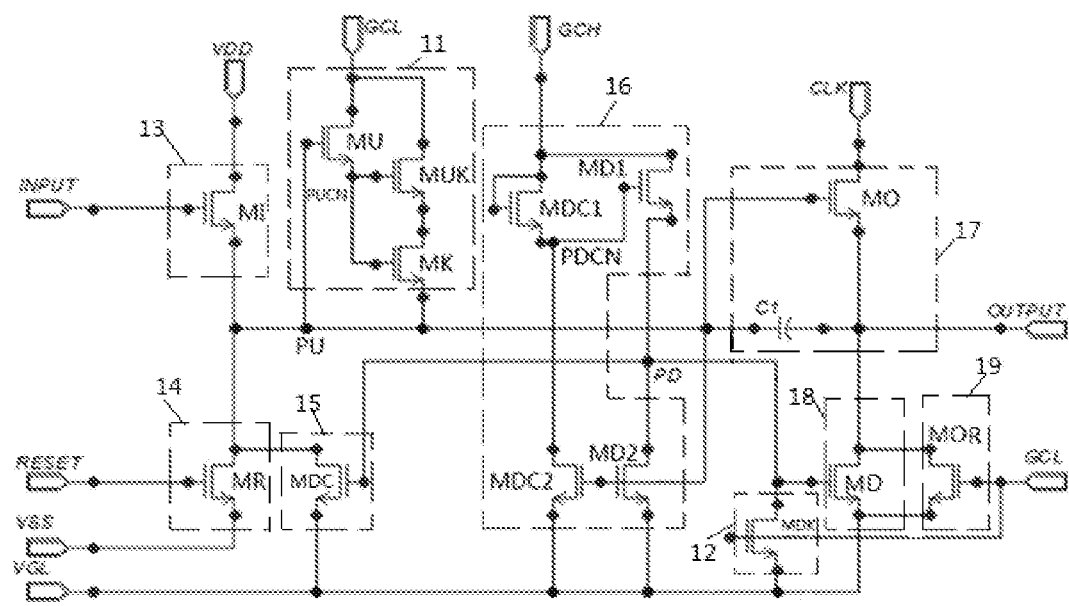
FIG. 3 is a specific circuit diagram of the shift register unit according to some embodiments of the present disclosure.

To be specific, as shown in FIG. 3, the pull-up node state maintenance circuitry 11 may for example include: a pull-up control node control transistor MU, a gate electrode of which is connected to the pull-up node PU, a drain electrode of which is connected to the first control voltage input end GCL, and a source electrode of which is connected to a pull-up control node PUCH; a pull-up node state maintenance transistor MUK, a gate electrode of which is connected to the pull-up control node PUCH, a drain electrode of which is connected to the first control voltage input end GCL, and a source electrode of which is connected to the pull-up node PU; and a switching transistor MK, a gate electrode of which is connected to the pull-up control node PUCN, a drain electrode of which is connected to the first control voltage input end GCL, and a source electrode of which is connected to the pull-up node PU.

The pull-down node maintenance circuitry 12 may for example include a pull-down node maintenance transistor MDK, a gate electrode of which is connected to the first control voltage input end GCL, a drain electrode of which is connected to the pull-down node PD, and a source electrode of which is connected to the low level input end for inputting the low level VGL.

The input circuitry 13 may for example include an input transistor MI, a gate electrode of which is connected to the input end INPUT, a drain electrode of which is connected to the high voltage input end for inputting the high voltage VDD, and a source electrode of which is connected to the pull-up node PU.

The resetting circuitry 14 may for example include a resetting transistor MR, a gate electrode of which is connected to the resetting end RESET, a drain electrode of which is connected to the pull-up node PU, and a source electrode of which is connected to the low voltage input end for inputting the low voltage VSS.

The first pull-down circuitry 15 may for example include a first pull-down transistor MDC, a gate electrode of which is connected to the pull-down node PD, a drain electrode of which is connected to the pull-up node PU, and a source electrode of which is connected to the low level input end for inputting the low level VGL.

The pull-down node control circuitry 16 may for example include: a first pull-down control node control transistor MDC1, a gate electrode and a drain electrode of which are connected to the third control voltage input end GCH, and a source electrode of which is connected to a pull-down control node PDCH; a second pull-down control node control transistor MDC2, a gate electrode is connected to the pull-up node PU, a drain electrode of which is connected to the pull-down control node PDCH, and a source electrode of which is connected to the low level input end for inputting the low level VGL; a first pull-down node control transistor MD1, a gate electrode of which is connected to the pull-down control node PDCN, a drain electrode of which is connected to the third control voltage input end GCH, and a source electrode of which is connected to the pull-down node PD; and a second pull-down node control transistor MD2, a gate electrode of which is connected to the pull-up node PU, a drain electrode of which is connected to the pull-down node PD, and a source electrode of which is connected to the low level input end for inputting the low level VGL.

The gate driving signal output circuitry 17 may for example include: an output transistor MO, a gate electrode of which is connected to the pull-up node PU, a drain electrode of which is connected to the clock signal input end CLK, and a source electrode of which is connected to the gate driving signal output end OUTPUT; and a storage capacitor C1, a first end of which is connected to the pull-up node PU, and a second end of which is connected to the gate driving signal output end OUTPUT.

The second pull-down circuitry 18 may for example include a second pull-down transistor MD, a gate electrode of which is connected to the pull-down node PD, a drain electrode of which is connected to the gate driving signal output end OUTPUT, and a source electrode of which is connected to the low level input end for inputting the low level VGL.

The gate driving signal resetting circuitry 19 may for example include a gate driving signal resetting transistor MOR, a gate electrode of which is connected to the first control voltage input end GCL, a drain electrode of which is connected to the gate driving signal output end OUTPUT, and a source electrode of which is connected to the low level input end for inputting the low level VGL.

In FIG. 3, all the transistors are N-type transistors. Of course, in actual use, the transistors may also be P-type transistors, and at this time, a sequence of control signals may be changed. In other words, the types of the transistors will not be particularly defined herein.

In FIG. 3, MDK is an N-type transistor, so the gate electrode of MDK may be connected to the first control voltage input end. When MDK is a P-type transistor, the gate electrode thereof needs to be connected to a second control voltage input end.

In the embodiments of the present disclosure, during the operation of the 14T1C-based shift register unit in FIG. 3, as compared with a conventional 10T1C shift register unit, four additional thin film transistors (TFTs) are provided, i.e., the pull-up control node control transistor MUC, the pull-up node state maintenance transistor MUK, the switching transistor MK and the pull-down node maintenance transistor MDK. Within a blanking time period (i.e., a touch time period), a first control voltage applied to the first control voltage input end GCL may be a high voltage, so as to forcibly pull down the potential at the pull-down node PD through MDK, thereby to enable MUC to be in a fully off state and prevent the occurrence of a significant current leakage at the pull-up node PU. In addition within the blanking time period (i.e., the touch time period), MUC may be turned on due to the potential at the pull-up node PU, so as to receive the high voltage from GCL, turn on MUK and MK, and apply the high voltage from GCL to the pull-up node PU, thereby to maintain the pull-up node at a high level within the blanking time period.

It is found through simulation that, for the 14T1C-based shift register unit in FIG. 3, it is able to provide a stronger capability for maintaining the potential at the pull-up node, and enable the pull-up node to be at a potential higher than the pull-up node of the 10T1C-based shift register unit after the blanking time period. Actually, after the blanking time period, the potential at the pull-up node of the 10T1C-based shift register unit may decrease more significantly. However, for the 14T1C-based shift register unit in the embodiments of the present disclosure, it is able to prevent the potential at the pull-up node from decreasing significantly, thereby to prevent the occurrence of the stripes.

Figure 4:
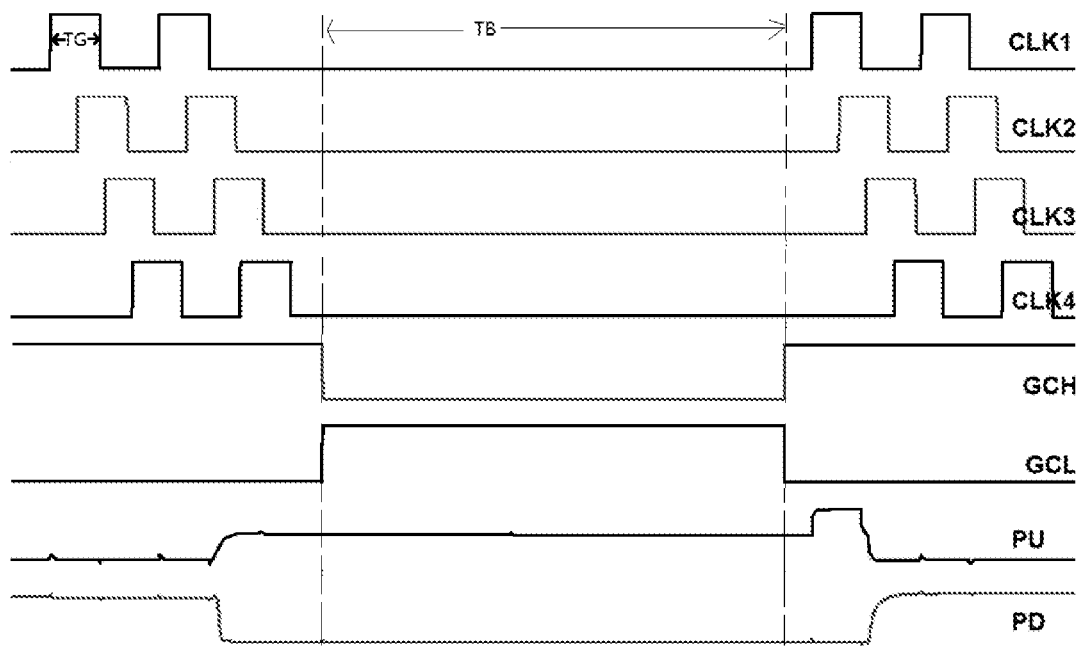
FIG. 4 is a sequence diagram of the shift register unit according to some embodiments of the present disclosure.

In actual use, as shown in FIG. 4, the during the operation of the shift register unit in FIG. 3, a high voltage may be applied to GCL and a low voltage may be applied to GCH within the blanking time period (i.e., the touch time period) TB. At this time, the pull-up node PU may be maintained at a high voltage, and the pull-down node PD may be at a low voltage.

In actual use, taking a GOA circuit including the shift register units in the embodiments of the present disclosure as an example, the shift register units at a left side and a right side may be driven alternately through 8-phase clock signals. A display panel may include 4 clock signal input ends at each side. No signal may be outputted from each clock signal input end within the blanking time period, and the first control voltage applied to GCL may have a phase inverted to the third control voltage applied to GCH. To be specific, a low voltage may be applied to GCH within the blanking time period while a high voltage may be applied to GCL within the blanking time period, and a high voltage may be applied to GCH within a display time period while a low voltage may be applied to GCL within the display time period.

In some possible embodiments of the present disclosure, the shift register units at the left side of the display panel may be connected to odd-numbered gate lines, and the shift register units at the right side of the display panel may be connected to even-numbered gate lines. For example, when the shift register unit in FIG. 3 is an $n^{th}$ shift register unit arranged at the left side of the display panel and connected to an odd-numbered gate line (n is a positive odd number greater than 2), the $n^{th}$ shift register unit may be connected to a first clock signal input end CLK1, an $(n+1)^{th}$ shift register unit arranged at the right side may be connected to a second clock signal input end CLK2, an $(n-2)^{th}$ shift register unit arranged at the left side may be connected to a third clock signal input end CLK3, and an $(n-1)^{th}$ shift register unit arranged at the right side may be connected to a fourth clock signal input end CLK4 (the odd-numbered shift register units at the left side may be connected to each other in a cascaded manner, and the even-numbered shift register units at the right side may be connected to each other in a cascaded manner).

As shown in FIG. 4, when a time period within which a first clock signal from CLK1 is maintained at a high level is TG, a second clock signal from CLK2 may be delayed by TG/2 with respect to the first clock signal from CLK1, a third clock signal from CLK3 may be delayed by TG/2 with respect to the second clock signal from CLK2, and a fourth clock signal from CLK4 may be delayed by TG/2 with respect to the third clock signal from CLK3. After a signal has been outputted from an $(n-2)^t$ shift register unit (which receives the third clock signal from CLK3), an pull-up node PU of the nth shift register unit (which receives the first clock signal from CLK1) may be pre-charged to be at a predetermined high potential, and after a certain time period (i.e., the blanking time period TB), a high voltage may be applied to CLK1. At this time, due to a bootstrapping effect, the potential at the pull-up node PU of the $n^{th}$ shift register unit (the potential at PU in FIG. 4 is just the potential at the pull-up node of the $n^{th}$ shift register unit) may be further pulled up. When leakage currents for MI, MR and MUC all connected to the pull-up node PU increase, the potential at the pull-up node PU may decrease significantly after the blanking time period TB, thereby an amplitude of the potential at the pull-up node PU may be adversely affected during a second pull-up operation.

In order to solve the above problem, through the pull-up node state maintenance circuitry 11, it is able to control the pull-up node PU to be electrically connected to the first control voltage input end GCL under the control of the pull-up node PU and the first control voltage input end GCL. In other words, when the potential at the pull-up node PU is a second level (e.g., a high level) and the first control voltage input end is also at the second level, it is able to control the pull-up node PU to be electrically connected to the first control voltage input end GCL through the pull-up node state maintenance circuitry 11, so as to maintain the high potential at the pull-up node PU in a better manner. In addition, through the pull-down node state maintenance circuitry 12, it is able to maintain the pull-down node PD at a first level (e.g., a low level) under the control of the first control voltage input end GCL within the blanking time period (i.e., the touch time period), so as to reduce the quantity of current leakage paths for the pull-up node PU, thereby to maintain the potential at the pull-up node PU.

The present disclosure further provides in some embodiments a method for driving the above-mentioned shift register unit, which includes, within the touch time period, applying a high voltage to the first control voltage input end, so as to enable the pull-up node state maintenance control circuitry to control the pull-up node of the shift register unit corresponding to a currently-scanned gate line to be electrically connected to the first control voltage input end.

Within the touch time period (i.e., the blanking time period), the pull-up node state maintenance control circuitry may control the pull-up node of the shift register unit corresponding to the currently-scanned gate line to be electrically connected to the first control voltage input end, so as to maintain the pull-up node at a high level, thereby to reduce the quantity of current leakage paths for the pull-up node. As a result, it is able for a gate driving circuit in the LH blanking touch driving mode to maintain the pull-up node of the shift register unit to be at a high level within the touch time period.

In some possible embodiments of the present disclosure, the method may further include, within a display time period, applying a low voltage to the first control voltage input end, so as to enable the pull-up node state maintenance circuitry to control the pull-up nodes of the shift register units corresponding all the gate lines to be electrically disconnected from the first control voltage input end.

Within the display time period, through the pull-up node state maintenance circuitry, it is able to control the pull-up node to be electrically disconnected from the first control voltage input end, thereby to prevent a normal display operation from being adversely affected.

In some possible embodiments of the present disclosure, the shift register unit may include the pull-down node state maintenance circuitry connected to the pull-down node, the second control voltage input end and the first level input end, and configured to control the pull-down node to be electrically connected to, or electrically disconnected from, the first level input end in accordance with an input potential at the second control voltage input end. The method may further include applying a low-level direct current signal to the first level input end, and controlling a voltage applied to the second control voltage input end within the touch time period, so as to enable the pull-down node state maintenance circuitry to control the pull-down node of the shift register unit corresponding to the currently-scanned gate line to be electrically connected to the first level input end.

Within the touch time period (i.e., the blanking time period), the low-level direct current signal may be applied to the first low level input end, so as to enable the pull-down node state maintenance circuitry to control the pull-down node of the shift register unit corresponding to the currently-scanned gate line to be electrically connected to the first level input end, thereby to enable the pull-down node to be at a low level and reduce the quantity of current leakage paths for the pull-up node. As a result, it is able for a gate driving circuit in the LH blanking touch driving mode to maintain the pull-up node of the shift register unit to be at a high level within the touch time period.

In some possible embodiments of the present disclosure, the method may further include, within the display time period, controlling the voltage applied to the second control voltage input end, so as to enable the pull-down node state maintenance circuitry to control the pull-down nodes of the shift register units corresponding to all the gate lines to be electrically disconnected from the first level input end, thereby to prevent the normal display operation from being adversely affected.

To be specific, the transistor included in the pull-down node state maintenance circuitry may be an N-type transistor, and the same control voltage may be applied to the first control voltage input end and the second control voltage input end, i.e., the first control voltage input end may also serve as the second control voltage input end, so as to reduce the space.

In some possible embodiments of the present disclosure, each frame may include at least two touch time periods and at least two display time periods arranged alternately. In other words, one display time period may be arranged between every two adjacent touch time periods. When a last time period of each frame is the touch time period, a first time period of a next frame may be the display time period.

Correspondingly, at least two touch time periods may be provided within each frame, so as to increase the touch frequency.

The above arrangement mode of the touch time periods and the display time periods is just the LH blanking touch driving mode. When each frame includes at least two touch time periods, it is able to increase the touch frequency.

The present disclosure further provides in some embodiments a gate driving circuit including a plurality of the above-mentioned shift register units connected to each other in a cascaded manner.

The present disclosure further includes in some embodiments a display device including the above-mentioned gate driving circuit.

According to the shift register unit, the driving method thereof, the gate driving circuit and the display device in the embodiments of the present disclosure, it is able to maintain the pull-up node of the shift register unit corresponding to the currently-scanned gate line to be at a high level within the blanking time period (i.e., the touch time period), and improve the potential maintenance capability of the pull-up node, thereby to prevent the occurrence of the stripes due to the significant decrease in the potential at the pull-up node within the touch time period as compared with the related art.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A shift register unit, comprising a pull-up node state maintenance circuitry connected to a pull-up node and a first control voltage input end, and configured to control the pull-up node to be electrically connected to, or electrically disconnected from, the first control voltage input end in accordance with a potential at the pull-up node and an input potential at the first control voltage input end, wherein the potential at the pull-up node is maintained by the pull-up node state maintenance circuitry,
wherein the pull-up node state maintenance circuitry includes:
a pull-up control node control sub-circuitry connected to the pull-up node, the first control voltage input end and a pull-up control node, and configured to control the pull-up control node to be electrically connected to, or electrically disconnected from, the first control voltage input end in accordance with the potential at the pull-up node; and
a pull-up node state maintenance sub-circuitry connected to the pull-up control node, the first control voltage input end and the pull-up node, and configured to control the pull-up node to be electrically connected to, or electrically disconnected from, the first control voltage input end in accordance with the potential at the pull-up control node,
wherein the pull-up node state maintenance sub-circuitry includes a pull-up node state maintenance transistor, a gate electrode of which is connected to the pull-up control node, a first electrode of which is connected to the first control voltage input end, and a second electrode of which is connected to the pull-up node,
wherein the pull-up node state maintenance sub-circuitry further includes a switching circuitry connected between the second electrode of the pull-up node state maintenance transistor and the pull-up node, a control end of the switching circuitry is connected to the pull-up control node, and the switching circuitry is configured to control the second electrode of the pull-up node state maintenance transistor to be electrically connected to, or electrically disconnected from, the pull-up node under a control of the pull-up control node,
wherein the switching circuitry includes a switching transistor, a gate electrode of which is connected to the pull-up control node, a first electrode of which is connected to the second electrode of the pull-up node state maintenance transistor, and a second electrode of which is connected to the pull-up node.

2. The shift register unit according to claim 1, wherein the pull-up control node control sub-circuitry includes a pull-up control node control transistor, a gate electrode of which is connected to the pull-up node, a first electrode of which is connected to the first control voltage input end, and a second electrode of which is connected to the pull-up control node.

3. The shift register unit according to claim 1, wherein the switching circuitry includes:
a first switching transistor, a gate electrode of which is connected to the pull-up control node, and a first electrode of which is connected to the second electrode of the pull-up node state maintenance transistor; and
a second switching transistor, a gate electrode of which is connected to the pull-up control node, a first electrode of which is connected to a second electrode of the first switching transistor, and a second electrode of which is connected to the pull-up node.

4. The shift register unit according to claim 1, wherein the switching circuitry includes N switching transistors, where N is an integer greater than 2;
a gate electrode of a first switching transistor is connected to the pull-up control node, and a first electrode of the first switching transistor is connected to the second electrode of the pull-up node state maintenance transistor;
a gate electrode of an $n^{th}$ switching transistor is connected to the pull-up control node, and a first electrode of the $n^{th}$ switching transistor is connected to a second electrode of an $(n-1)^{th}$ switching transistor, where n is an integer greater than 1 and smaller than N; and
a gate electrode of an $N^{th}$ switching transistor is connected to the pull-up control node, a first electrode of the $N^{th}$ switching transistor is connected to a second electrode of an $(N-1)^{th}$ switching transistor, and a second electrode of the $N^{th}$ switching transistor is connected to the pull-up node.

5. The shift register unit according to claim 1, wherein the pull-up node state maintenance circuitry include a transistor, a gate electrode and a drain electrode of which are connected to the pull-up node, and a source electrode of which is connected to the first control voltage input end.

6. The shift register unit according to claim 1, further comprising a pull-down node state maintenance circuitry connected to a pull-down node, a second control voltage input end and a first level input end, and configured to control the pull-down node to be electrically connected to, or electrically disconnected from, the first level input end in accordance with an input potential at the second control voltage input end.

7. The shift register unit according to claim 6, wherein the pull-down node state maintenance circuitry includes a pull-down node maintenance transistor, a gate electrode of which is connected to the second control voltage input end, a first electrode of which is connected to the pull-down node, and a second electrode of which is connected to the first level input end.

8. A method for driving the shift register unit according to claim 1, comprising, within a touch time period, applying a high voltage to a first control voltage input end, wherein a pull-up node state maintenance control circuitry is caused to control a pull-up node of the shift register unit corresponding to a currently-scanned gate line to be electrically connected to the first control voltage input end.

9. The method according to claim 8, further comprising, within a display time period, applying a low voltage to the first control voltage input end, wherein the pull-up node state maintenance circuitry is caused to control the pull-up nodes of the shift register units corresponding all the gate lines to be electrically disconnected from the first control voltage input end.

10. The method according to claim 8, wherein the shift register unit includes a pull-down node state maintenance circuitry connected to a pull-down node, a second control voltage input end and a first level input end, and configured to control the pull-down node to be electrically connected to, or electrically disconnected from, the first level input end in accordance with an input potential at the second control voltage input end,
wherein the method further comprises applying a low-level direct current (DC) signal to the first level input end, and controlling a voltage applied to the second control voltage input end within the touch time period, wherein the pull-down node state maintenance circuitry is caused to control the pull-down node of the shift register unit corresponding to the currently-scanned gate line to be electrically connected to the first level input end.

11. The method according to claim 10, further comprising, within the display time period, controlling the voltage applied to the second control voltage input end, wherein the pull-down node state maintenance circuitry is caused to control the pull-down nodes of the shift register units corresponding to all the gate lines to be electrically disconnected from the first level input end.

12. The method according to claim 8, wherein the pull-down node state maintenance circuitry includes an N-type transistor configured to apply a same control voltage to the first control voltage input end and the second control voltage input end.

13. The method according to claim 8, wherein each frame includes at least two touch time periods and at least two display time periods arranged alternately.

14. A gate driving circuit comprising a plurality of the shift register units according to claim 1 connected to each other in a cascaded manner.

15. A display device, comprising the gate driving circuit according to claim 14.

16. The gate driving circuit according to claim 14, wherein the gate driving circuit is a Gate on Array (GOA) driving circuit.

17. A shift register unit, comprising a pull-up node state maintenance circuitry connected to a pull-up node and a first control voltage input end, and configured to control the pull-up node to be electrically connected to, or electrically disconnected from, the first control voltage input end in accordance with a potential at the pull-up node and an input potential at the first control voltage input end, wherein the potential at the pull-up node is maintained by the pull-up node state maintenance circuitry,
wherein the pull-up node state maintenance circuitry includes:
a pull-up control node control sub-circuitry connected to the pull-up node, the first control voltage input end and a pull-up control node, and configured to control the pull-up control node to be electrically connected to, or electrically disconnected from, the first control voltage input end in accordance with the potential at the pull-up node; and
a pull-up node state maintenance sub-circuitry connected to the pull-up control node, the first control voltage input end and the pull-up node, and configured to control the pull-up node to be electrically connected to, or electrically disconnected from, the first control voltage input end in accordance with the potential at the pull-up control node,
wherein the pull-up node state maintenance sub-circuitry includes a pull-up node state maintenance transistor, a gate electrode of which is connected to the pull-up control node, a first electrode of which is connected to the first control voltage input end, and a second electrode of which is connected to the pull-up node,
wherein the pull-up node state maintenance sub-circuitry further includes a switching circuitry connected between the second electrode of the pull-up node state maintenance transistor and the pull-up node, a control end of the switching circuitry is connected to the pull-up control node, and the switching circuitry is configured to control the second electrode of the pull-up node state maintenance transistor to be electrically connected to, or electrically disconnected from, the pull-up node under a control of the pull-up control node,
wherein the switching circuitry includes N switching transistors, where N is an integer greater than or equal to 2;
a gate electrode of a first switching transistor is connected to the pull-up control node, and a first electrode of the first switching transistor is connected to the second electrode of the pull-up node state maintenance transistor;
a gate electrode of an $n^{th}$ switching transistor is connected to the pull-up control node, and a first electrode of the $n^{th}$ switching transistor is connected to a second electrode of an $(n-1)^{th}$ switching transistor, where n is an integer greater than 1 and smaller than N; and
a gate electrode of an $N^{th}$ switching transistor is connected to the pull-up control node, a first electrode of the $N^{th}$ switching transistor is connected to a second electrode of an $(N-1)^{th}$ switching transistor, and a second electrode of the $N^{th}$ switching transistor is connected to the pull-up node.

18. A method for driving a shift register unit comprising a pull-up node state maintenance circuitry connected to a pull-up node and a first control voltage input end, and configured to control the pull-up node to be electrically connected to, or electrically disconnected from, the first control voltage input end in accordance with a potential at the pull-up node and an input potential at the first control voltage input end, wherein the potential at the pull-up node is maintained by the pull-up node state maintenance circuitry,
wherein the method comprises:
within a touch time period, applying a high voltage to a first control voltage input end, wherein a pull-up node state maintenance control circuitry is caused to control a pull-up node of the shift register unit corresponding to a currently-scanned gate line to be electrically connected to the first control voltage input end,
within a display time period, applying a low voltage to the first control voltage input end, wherein the pull-up node state maintenance circuitry is caused to control the pull-up nodes of the shift register units corresponding all the gate lines to be electrically disconnected from the first control voltage input end, wherein the shift register unit includes a pull-down node state maintenance circuitry connected to a pull-down node, a second control voltage input end and a first level input end, and configured to control the pull-down node to be electrically connected to, or electrically disconnected from, the first level input end in accordance with an input potential at the second control voltage input end, wherein the method further comprises applying a low-level direct current (DC) signal to the first level input end, and controlling a voltage applied to the second control voltage input end within the touch time period, wherein the pull-down node state maintenance circuitry is caused to control the pull-down node of the shift register unit corresponding to the currently-scanned gate line to be electrically connected to the first level input end.

* * * * *